United States Patent
O'Young et al.

(10) Patent No.: US 10,559,927 B2
(45) Date of Patent: Feb. 11, 2020

(54) SWITCHABLE RJ45/ARJ45 JACK

(71) Applicant: Panduit Corp., Tinley Park, IL (US)

(72) Inventors: Jason O'Young, Tinley Park, IL (US);
Robert E. Fransen, Orland Park, IL (US); Samuel M. Marrs, Bradley, IL (US); Satish I. Patel, Roselle, IL (US); Paul W. Wachtel, Arlington Heights, IL (US); Andrew Ciezak, Georgetown, TX (US)

(73) Assignee: Panduit Corp., Tinley Park, IL (US)

( * ) Notice: Subject to any disclaimer, the term of this patent is extended or adjusted under 35 U.S.C. 154(b) by 146 days.

(21) Appl. No.: 15/028,039

(22) PCT Filed: Oct. 10, 2014

(86) PCT No.: PCT/US2014/060025
§ 371 (c)(1),
(2) Date: Apr. 8, 2016

(87) PCT Pub. No.: WO2015/054566
PCT Pub. Date: Apr. 16, 2015

(65) Prior Publication Data
US 2016/0254620 A1    Sep. 1, 2016
US 2017/0170607 A9   Jun. 15, 2017

Related U.S. Application Data

(60) Provisional application No. 61/889,723, filed on Oct. 11, 2013.

(51) Int. Cl.
*H01R 13/6473* (2011.01)
*H01R 24/64* (2011.01)
*H01R 13/703* (2006.01)
*H01R 29/00* (2006.01)

(52) U.S. Cl.
CPC ....... *H01R 13/6473* (2013.01); *H01R 13/703* (2013.01); *H01R 24/64* (2013.01); *H01R 29/00* (2013.01)

(58) Field of Classification Search
CPC .............. H01R 13/6473; H01R 13/703; H01R 13/6469; H01R 13/7039; H01R 24/64; H01R 29/00; H05K 1/0228
USPC ...... 439/76.1, 676, 238, 261, 288, 341, 372, 439/506, 838, 104, 294, 773, 864
See application file for complete search history.

(56) References Cited

U.S. PATENT DOCUMENTS

| | | |
|---|---|---|
| 6,056,568 A | 5/2000 | Arnett |
| 6,079,996 A * | 6/2000 | Arnett ................ H01R 13/6466 200/51.06 |
| 6,193,533 B1 | 2/2001 | DeWin et al. |
| 6,244,908 B1 | 6/2001 | Hammond et al. |
| 6,394,853 B1 | 5/2002 | Hammond et al. |
| 6,736,681 B2 | 5/2004 | Arnett |
| 6,739,892 B1 | 5/2004 | Belopolsky et al. |

(Continued)

*Primary Examiner* — Harshad C Patel
(74) *Attorney, Agent, or Firm* — Christopher S. Clancy; James H. Williams; Christopher K. Marlow

(57) ABSTRACT

A communication connector has a housing for receiving a communication plug, a printed circuit within the housing, a switch which actuates the printed circuit board, and a translating crossbar which engages the switch. The printed circuit board is moved dependent upon a type of plug inserted. The movement of the circuit board can help to selectively engage one of two sets of circuit traces and groupings of contacts.

4 Claims, 12 Drawing Sheets

(56) References Cited

U.S. PATENT DOCUMENTS

| | | |
|---|---|---|
| 7,534,143 B1 | 5/2009 | Tsao et al. |
| 7,686,650 B2 | 3/2010 | Belopolsky et al. |
| 7,993,166 B1 * | 8/2011 | Kline .................... H01R 24/64 439/676 |
| 8,944,855 B2 * | 2/2015 | Bolouri-Saransar ......................... H01R 13/6461 439/218 |
| 2009/0186532 A1 * | 7/2009 | Goodrich ............... H01R 13/64 439/676 |
| 2013/0090011 A1 | 4/2013 | Bolouri-Saransar et al. |
| 2014/0273570 A1 * | 9/2014 | Fransen ................ H01R 24/64 439/174 |
| 2014/0273633 A1 * | 9/2014 | Gatnau Navarro .. H01R 13/665 439/620.01 |

\* cited by examiner

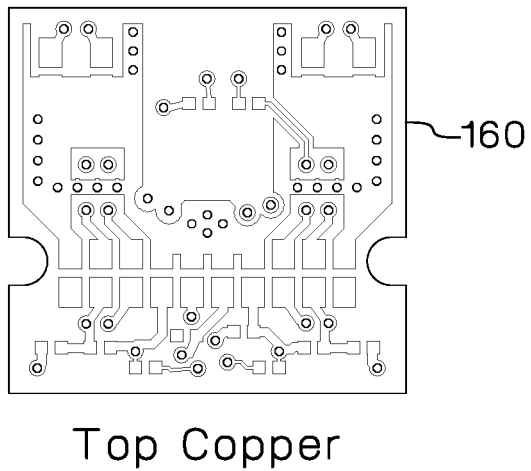
Top Copper
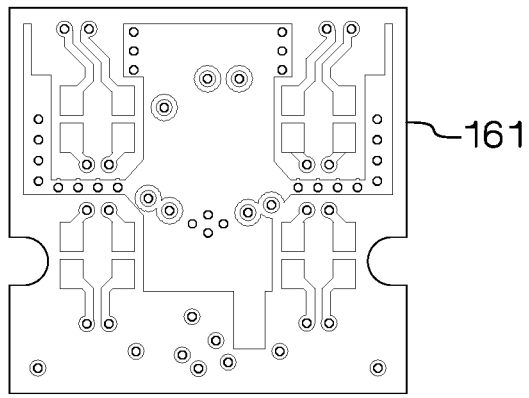
Bottom Copper
FIG.12
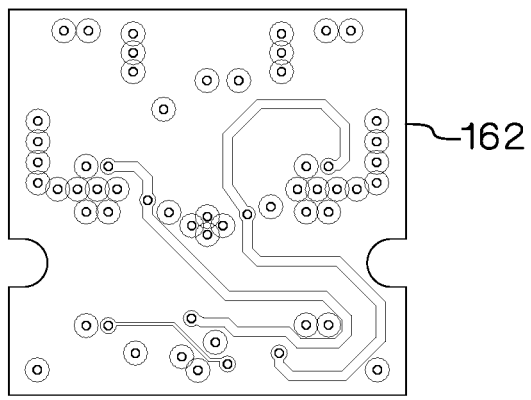
Inner 3
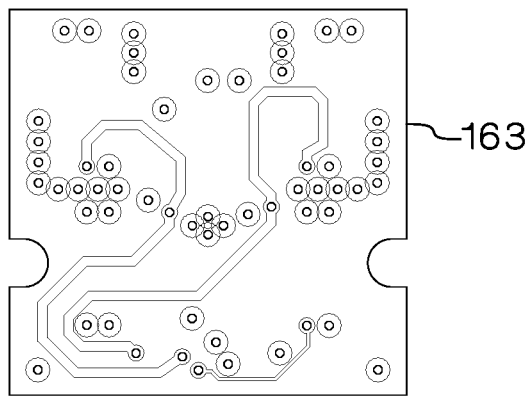
Inner 4
FIG.13
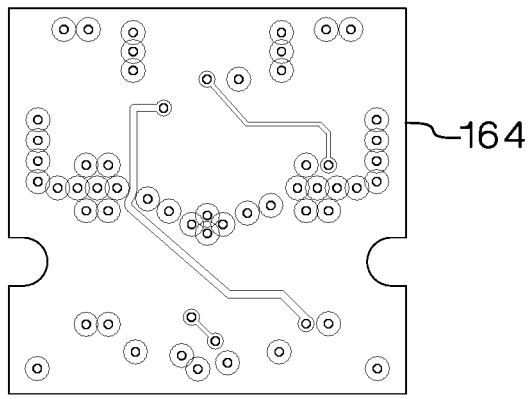
Inner 2
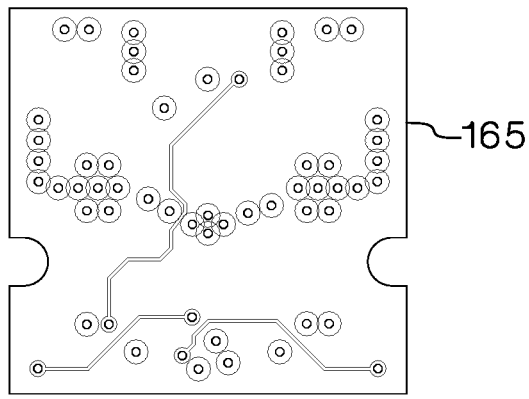
Inner 5
FIG.14

SWITCHABLE RJ45/ARJ45 JACK

CROSS-REFERENCE TO RELATED APPLICATIONS

This application claims priority to U.S. Provisional Application No. 61/889,723, filed Oct. 11, 2013, the subject matter of which is hereby incorporated by reference in its entirety.

FIELD OF THE INVENTION

The present invention relates to the field of telecommunication jacks, and more specifically, to network jacks adapted for operating with more than one type of a plug.

BACKGROUND OF THE INVENTION

The use of electronic equipment such as personal computers, servers, and other network operable devices has continued to progress over the past decades. This progression has been accompanied by an increased need to transfer large amounts of data at ever-increasing speeds and the resulting requirement of a sufficiently powerful network infrastructure. One particular area of concentration within network infrastructure has been the plug/jack mating region together with the individual plug and jack components. It is within these components that increasingly offensive crosstalk often occurs at high bandwidths.

As of today, the RJ45 connector has been one of the commonly used standards for making electrical connections within a network. While this standard is widely employed, the physical layout of electrical conductors in an RJ45 connector can cause increasing levels of crosstalk at higher bandwidths. To combat unwanted crosstalk, new plug/jack designs have been implemented. However, to ensure the ability to interface RJ45 components to new networks, it is desirable to have the new plug/jack designed be backwards compatible.

U.S. patent application Ser. No. 13/632,211 and 61/779,806, both of which are herein incorporated by reference in their entirety, each describe a switchable RJ45/ARJ45 jack that has a movable printed circuit board (PCB) which allows for two different modes of operation. A mode of operation is used when an RJ45 plug is inserted into the jack and supports a performance level up to Category 6A (CAT6A, 500 MHz). However, for higher performance and higher bandwidth (e.g. 2 GHz, 40 Gb/s) an alternate mode of operation is used. The alternate mode of operation is attained when an ARJ45 plug (compliant to IEC 60603-7-7 and IEC 61076-3-110) is inserted into the jack. An example of an ARJ45 plug is described in U.S. application Ser. No. 13/864,924 which is also herein incorporated by reference in its entirety. The long nose of the ARJ45 plug (as compared to an RJ45 plug) causes the PCB to move to an alternate position in the design of both the '211 and '806 patent applications and thus creates the secondary mode of operation.

SUMMARY

A communication connector has a housing for receiving a communication plug, a printed circuit within the housing, a switch which actuates the printed circuit board, and a translating crossbar which engages the switch. The printed circuit board is moved dependent upon a type of plug inserted. The movement of the circuit board can help to selectively engage one of two sets of circuit traces and groupings of contacts.

BRIEF DESCRIPTION OF FIGURES

FIGS. 12-14 are views of the various layers of traces for the PCB of FIG. 11.

DETAILED DESCRIPTION

The present invention is a switchable RJ45/ARJ45 jack suitable for both 10 Gb/s and 40 Gb/s performance.

Figure 1:
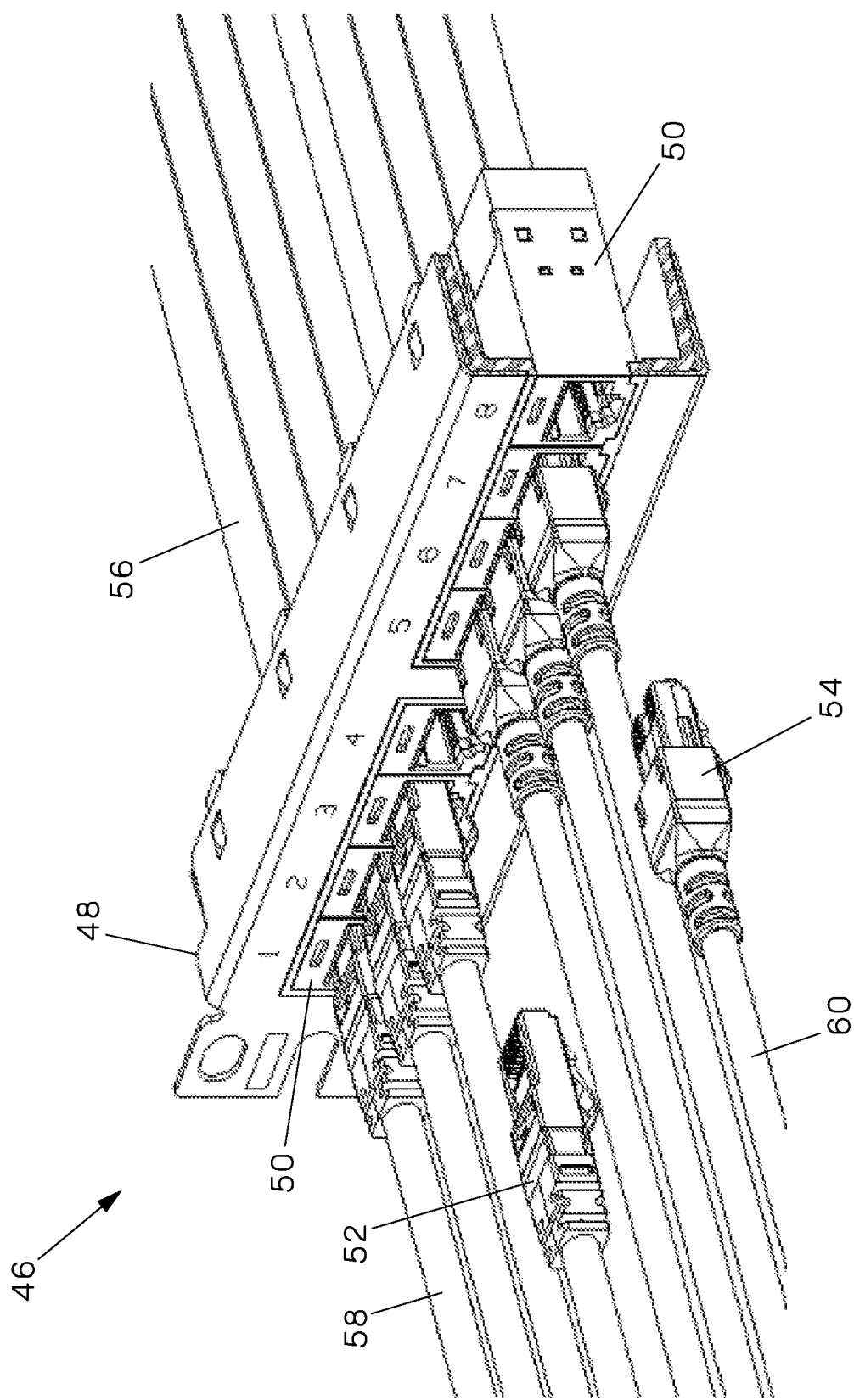
FIG. 1 is a perspective view of a communication system using an RJ45/ARJ45 switchable jack according to an embodiment of the present invention.

FIG. 1 illustrates copper structured cabling communication system 46 which includes patch panel 48 with switchable RJ45/ARJ45 jacks 50 and corresponding RJ45 plugs 52 and ARJ45 plugs 54. Respective horizontal cables 56 are terminated to switchable RJ45/ARJ45 jacks 50, respective patch cables 58 are terminated to RJ45 plugs 52, and respective shielded patch cables 60 are terminated to ARJ45 plugs 54. Once RJ45 plug 52 or ARJ45 plug 54 mates with switchable RJ45/ARJ45 jack 50 data can flow in both directions through these connectors.

Figure 2:
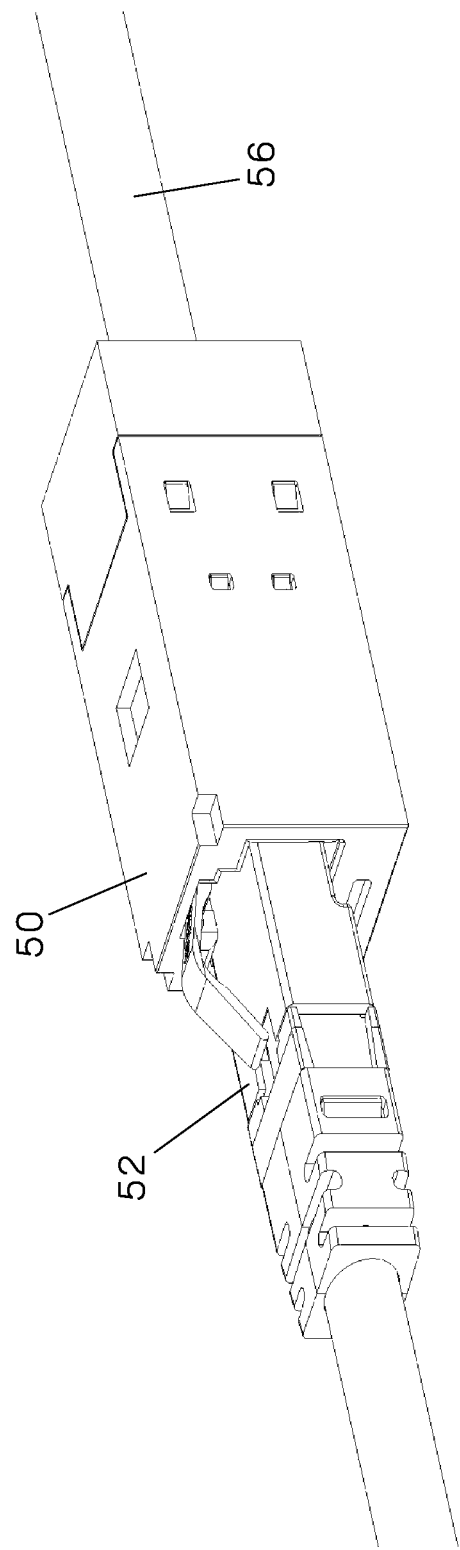
FIG. 2 is a perspective view of the RJ45/ARJ45 switchable jack of the communication system of FIG. 1, according to an embodiment of the present invention, with an RJ45 plug inserted.
Figure 3:
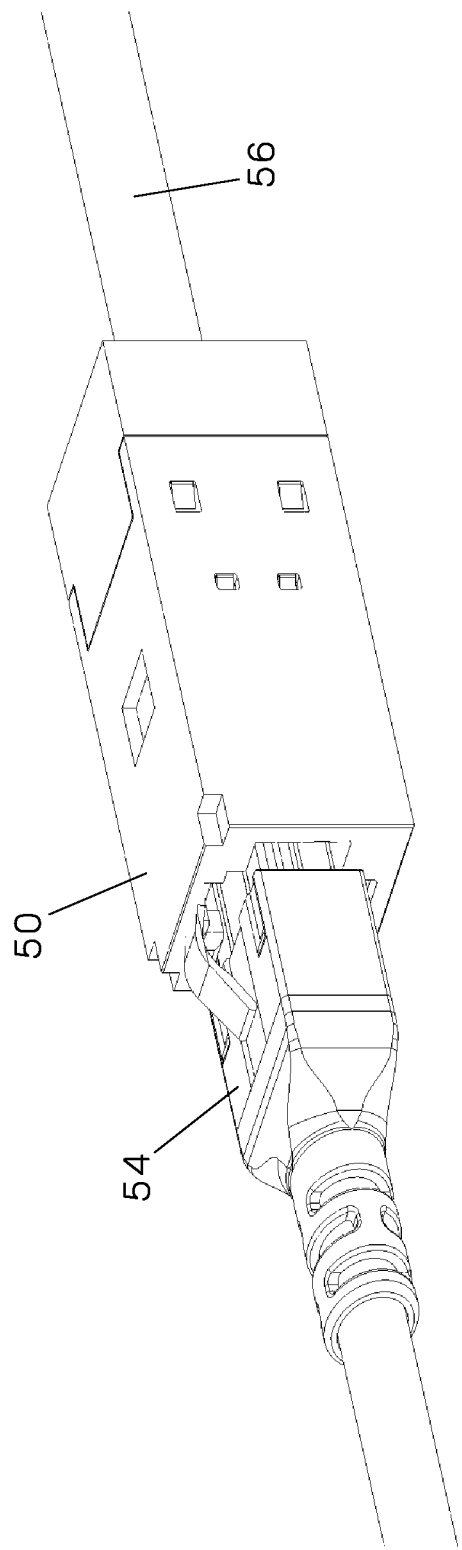
FIG. 3 is a perspective view of the RJ45/ARJ45 switchable jack of FIG. 2 with an ARJ45 plug inserted.

FIG. 2 illustrates switchable RJ45/ARJ45 jack 50 mated with RJ45 plug 52, rotated 180° about the central axis of cable 56 relative to the orientation from FIG. 1. When RJ45 plug 52 is used with switchable RJ45/ARJ45 jack 50, it is possible to obtain up to CAT6A performance. For higher performance and higher bandwidth (e.g. 2 GHz) ARJ45 plug 54 must be used with switchable RJ45/ARJ45 jack 50 as shown in FIG. 3, also rotated 180° about the central axis of cable 56 relative to the orientation from FIG. 1.

Figure 4:
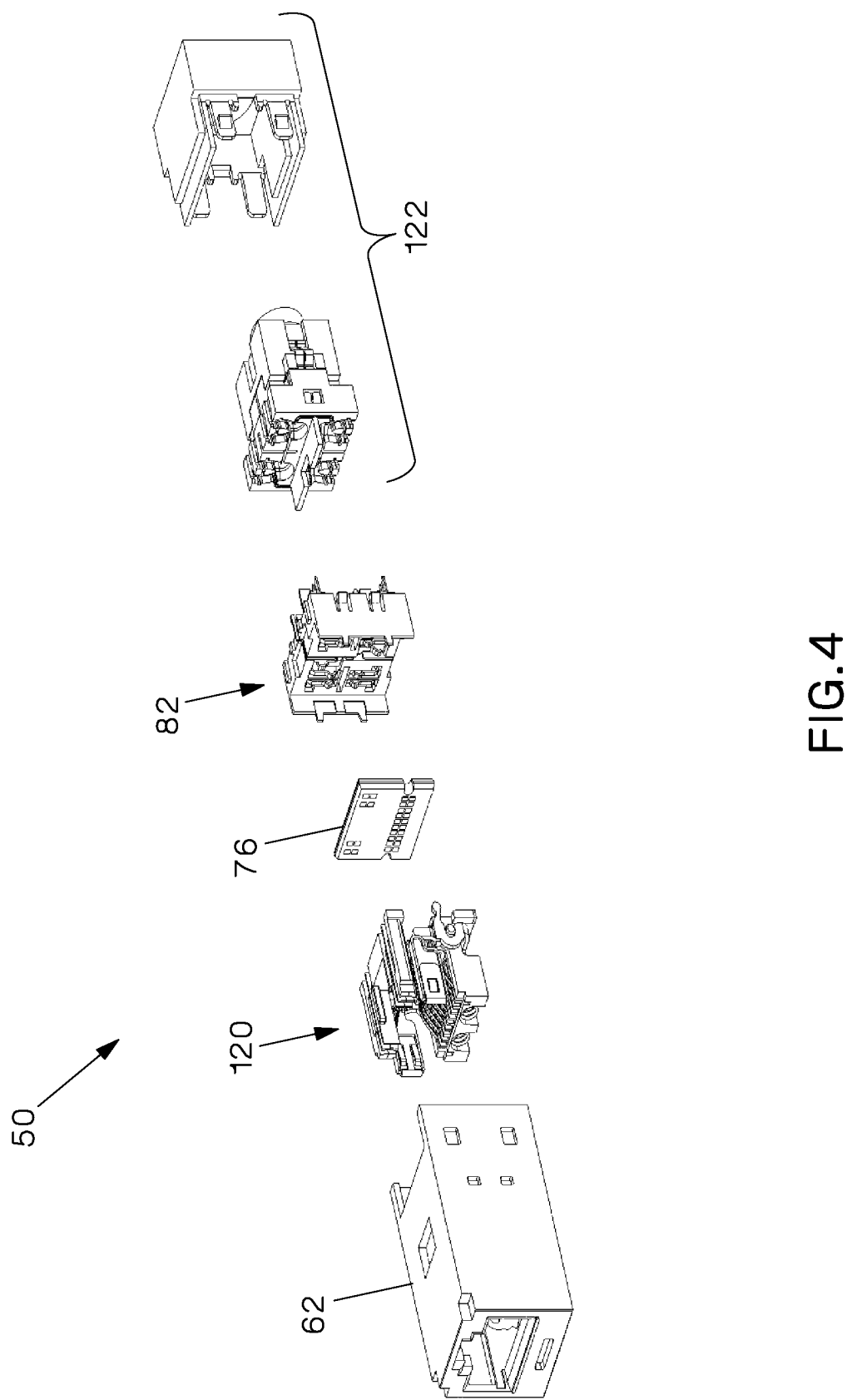
FIG. 4 is an exploded view of the RJ45/ARJ45 switchable jack of FIG. 2.

Switchable RJ45/ARJ45 jack 50, shown exploded in FIG. 4, includes metal housing 62, front nose assembly 120, PCB 76, IDC assembly 82, and rear cap assembly 122.

Figure 5:
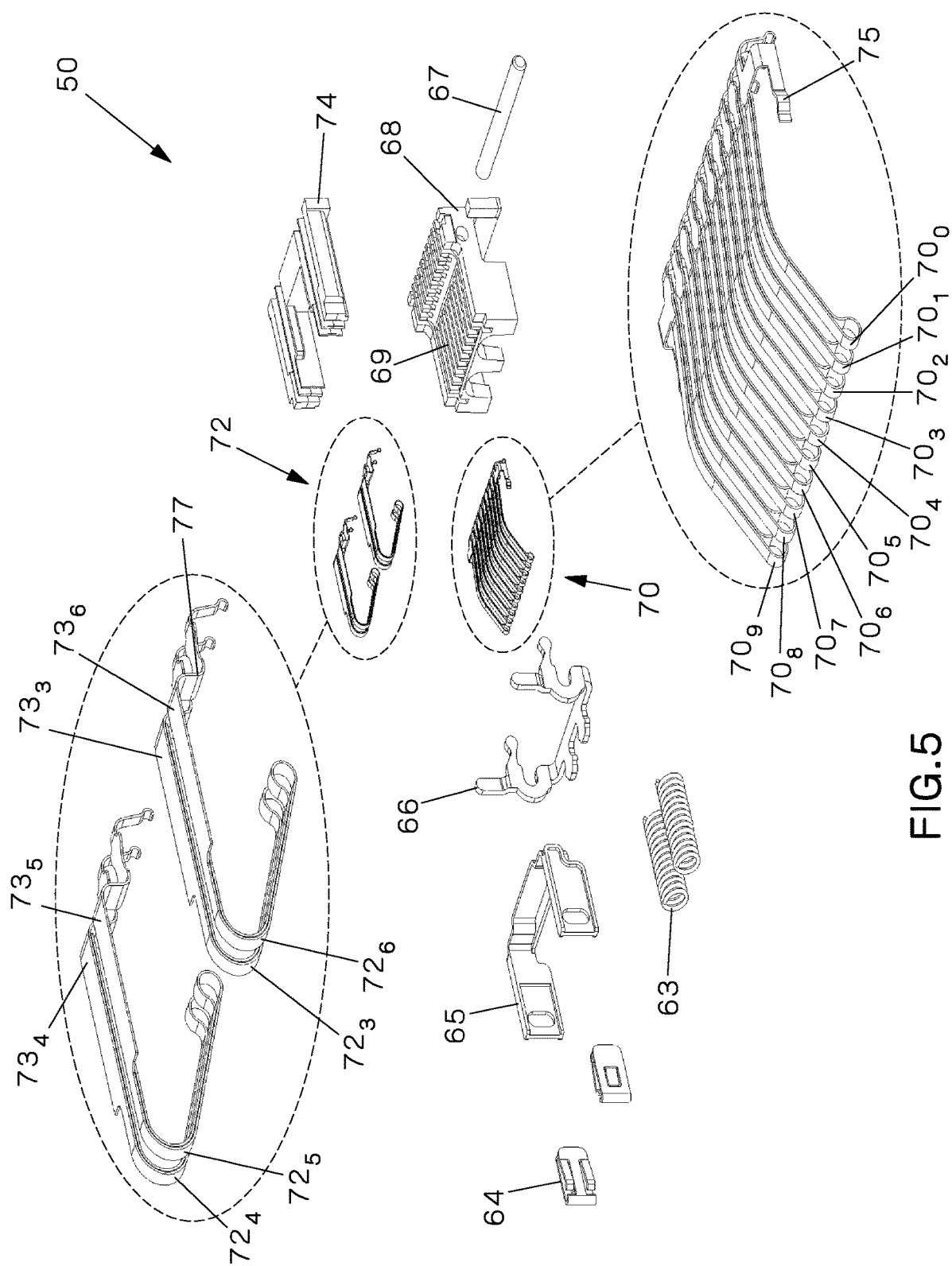
FIG. 5 is an exploded view of the front nose assembly of the RJ45/ARJ45 switchable jack of FIG. 2.

Front nose assembly 120, shown exploded in FIG. 5, includes crossbar 65 with plug grounding tabs 64. When ARJ45 plug 54 is inserted into RJ45/ARJ45 jack 50, crossbar 65 pushes on rocker switch 66 which then pushes PCB 76 down into its high bandwidth mode (ARJ45). Springs 63 are compressed between metal housing 62 and rocker switch 66 such that it biases switchable RJ45/ARJ45 jack 50 to its RJ45 state when ARJ45 plug 54 is withdrawn from switchable RJ45/ARJ45 jack 50 causing the rocker switch to pull PCB 76 up into its RJ45 position. Rocker switch 66 toggles switchable jack 50 between the RJ45 and switched high bandwidth mode of operation based upon which type of plug is inserted. Hinge pin 67 is inserted into front PIC support structure 68 and holds rocker switch 66.

Front PIC support structure 68 also constrains PICs $70_{0-9}$ with combs 69. PICs $70_1$-$70_8$ are numbered in accordance with ANSI/TIA-568-C.2 and are used as signal transmission paths when an RJ45 plug is used. PICs $70_0$ and $70_9$ are always grounded and are used to balance the ground around signal pairs 1:2 and 7:8 during the high bandwidth mode of operation. PICs 72 are located physically in compliance with IEC 60603-7-7 and are supported by prime PIC support structure 74. PICs 72 have region 73 which increases in width relative to the free end that interfaces with the plug contacts of ARJ45 plug 54, and also includes bends 77 to bring region 73 closer to metal housing 62 for impedance matching. The increase in width increases capacitive coupling and helps bring the impedance of the differential pairs that use PICs 72 close to 100Ω. Without wider region 73, the impedance through PICs 72 is above 100Ω (~130Ω), which causes additional return loss. The extra width of region 73 increases capacitive coupling in that region between prime PICs $72_4$ and $72_5$ as well as between prime PICs $72_3$ and $72_6$. The relative closeness of metal housing 62 to region 73 also provides a path for capacitive coupling that aids in bringing the impedance through this region close to 100Ω. PICs 72 are grounded during RJ45 mode of operation but used as signal transmission paths during high bandwidth mode. When in RJ45 mode, the signal transmission pairs are on $70_1$, $70_2$; $70_3$, $70_6$; $70_4$, $70_5$; and $70_7$, $70_8$. Remaining PICs $70_0$, $70_9$, $72_3$, $72_6$, $72_4$, $72_5$ are grounded. When in high bandwidth mode, the signal transmission pairs are on $72_4$, $72_5$; $72_3$, $72_6$; $70_1$, $70_2$; and $70_7$, $70_8$. Remaining PICs $70_0$, $70_3$, $70_4$, $70_5$, $70_6$, $70_9$ are grounded.

PICs 70 and 72 are constructed of a thin (less than 0.014 inches, preferably 0.004 to 0.010 inches, more preferably 0.006 to 0.008 inches, even more preferably 0.007 inches) metallic material, although nonmetallic or insulative materials can also be used for some of the layers. The use of thinner material improves PIC flexibility to reduce susceptibility to internal stresses imparted during bending. To improve normal force between PICs 70 and 72 and the plug contacts of either RJ45 plug 52 or ARJ45 plug 54, PICs 70 and 72 are folded back upon their respective selves to create layered PICs. PICs $70_0$ and $70_9$ have an additional contact surface 75 on the side for the purpose of providing a ground path for rocker switch 66. The use of thin material allow PICs 70 to have a relatively short electrical length.

Figure 6:
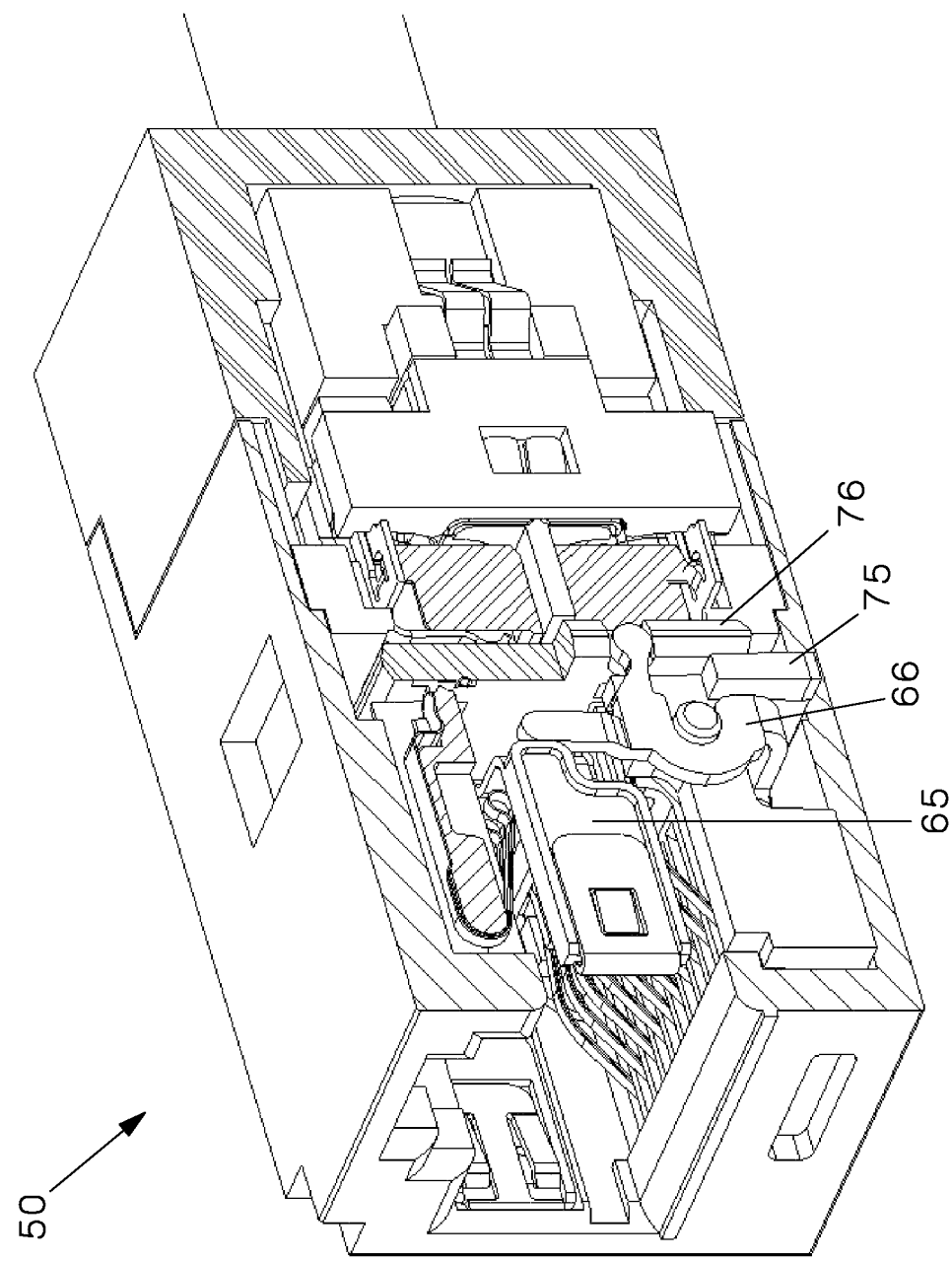
FIG. 6 is a perspective cut-away view of the RJ45/ARJ45 switchable jack of FIG. 2 without any plugs inserted into the jack.
Figure 7:
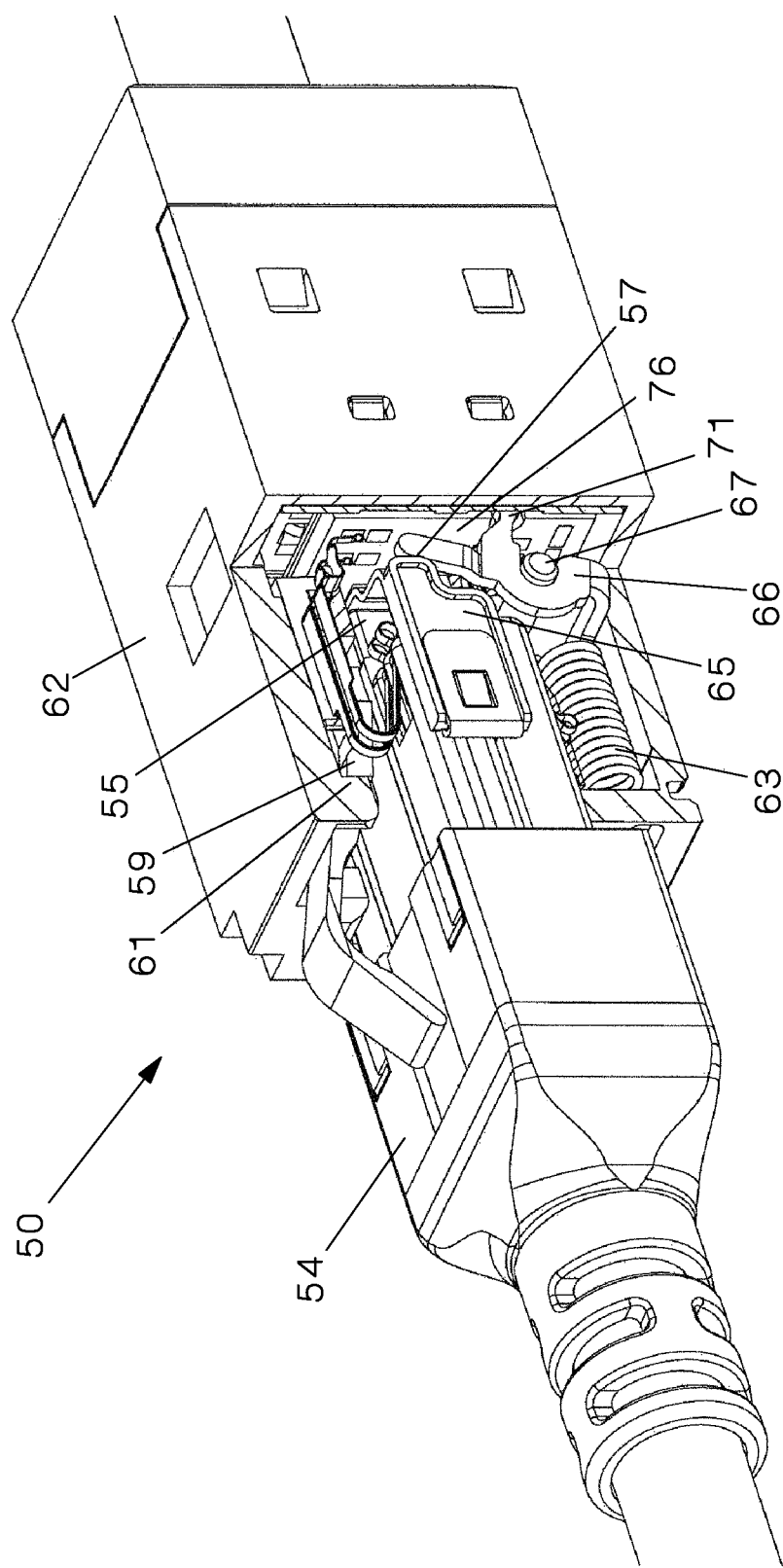
FIG. 7 is a perspective cut-away view of the RJ45/ARJ45 switchable jack of FIG. 2 with an ARJ45 plug inserted into the jack.

FIG. 6 depicts switchable RJ45/ARJ45 jack 50 in its RJ45 state where crossbar 65, rocker switch 66, and PCB 76 are in their RJ45 position. This natural state is unchanged when RJ45 plug 52 is inserted into switchable RJ45/ARJ45 jack 50. FIG. 7 depicts switchable RJ45/ARJ45 jack 50 in its actuated state with ARJ45 plug 54 locked into place. When ARJ45 plug 54 is inserted into RJ45/ARJ45 jack 50, the nose 55 of ARJ45 plug engages and pushes crossbar 65. The motion of crossbar 65 is transferred to rocker switch 66 at interface 57 and causes rocker switch 66 to rotate about hinge pin 67. The rotation of rocker switch 66 drives the translation of PCB 76 into its actuated high bandwidth state through interface 71. Compression springs 63 resist the rotation of rocker switch 66 and therefore drive the opposite rotation when ARJ45 plug 54 is removed, returning RJ45/ARJ45 jack 50 to its natural RJ45 state. The potential energy in springs 63 cause crossbar 65 to constantly exert force upon nose 55 of ARJ45 plug 54. That force pushes ARJ45 plug away until plug latch 59 is mated against latch stop 61 of housing 62. An equivalent phenomenon exists when RJ45 plug 52 is used. The nose of RJ45 plug 52 engages crossbar 65, but the nose is not long enough to drive the switching mechanism and activate the high bandwidth state. However, crossbar 65 still drives RJ45 plug 52 so that the plug latches mate against the latch stops 61 in housing 62. The preload in the switch causes either ARJ45 plug 54 or RJ45 52 to be positioned such that the plug latch mates against the latch stops and therefore does not "float" inside of RJ45/ARJ45 jack 50.

Figure 8:
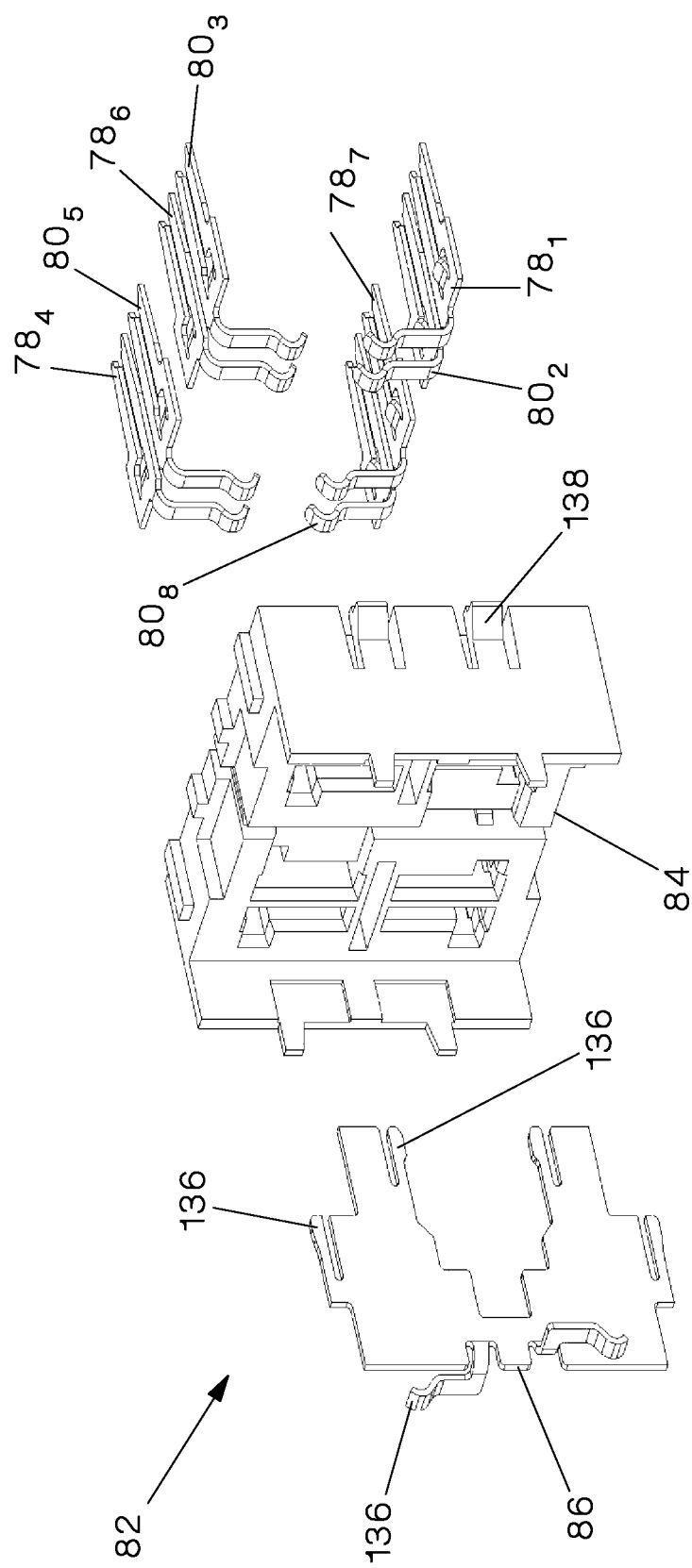
FIG. 8 is an exploded view of the IDC assembly of the RJ45/ARJ45 switchable jack of FIG. 2.

IDC assembly 82, shown exploded in FIG. 8 is composed of IDC holder 84, four IDCs $78_{1,4,6,7}$ and four IDCs $80_{2,3,5,8}$. Vertical IDC isolator 86 and horizontal IDC isolator 140 from foil divider 124 (see FIG. 9) in rear cap assembly 122 reduce internal crosstalk among the four signal pairs. Vertical IDC isolator 86 has contact surfaces 136 that provide a ground path between PCB 76, housing 62, and grounding contact 126. Mounting snaps 138 secure IDC assembly 82 to metal housing 62 and locks nose assembly 120 and PCB 76 into position.

Figure 9:
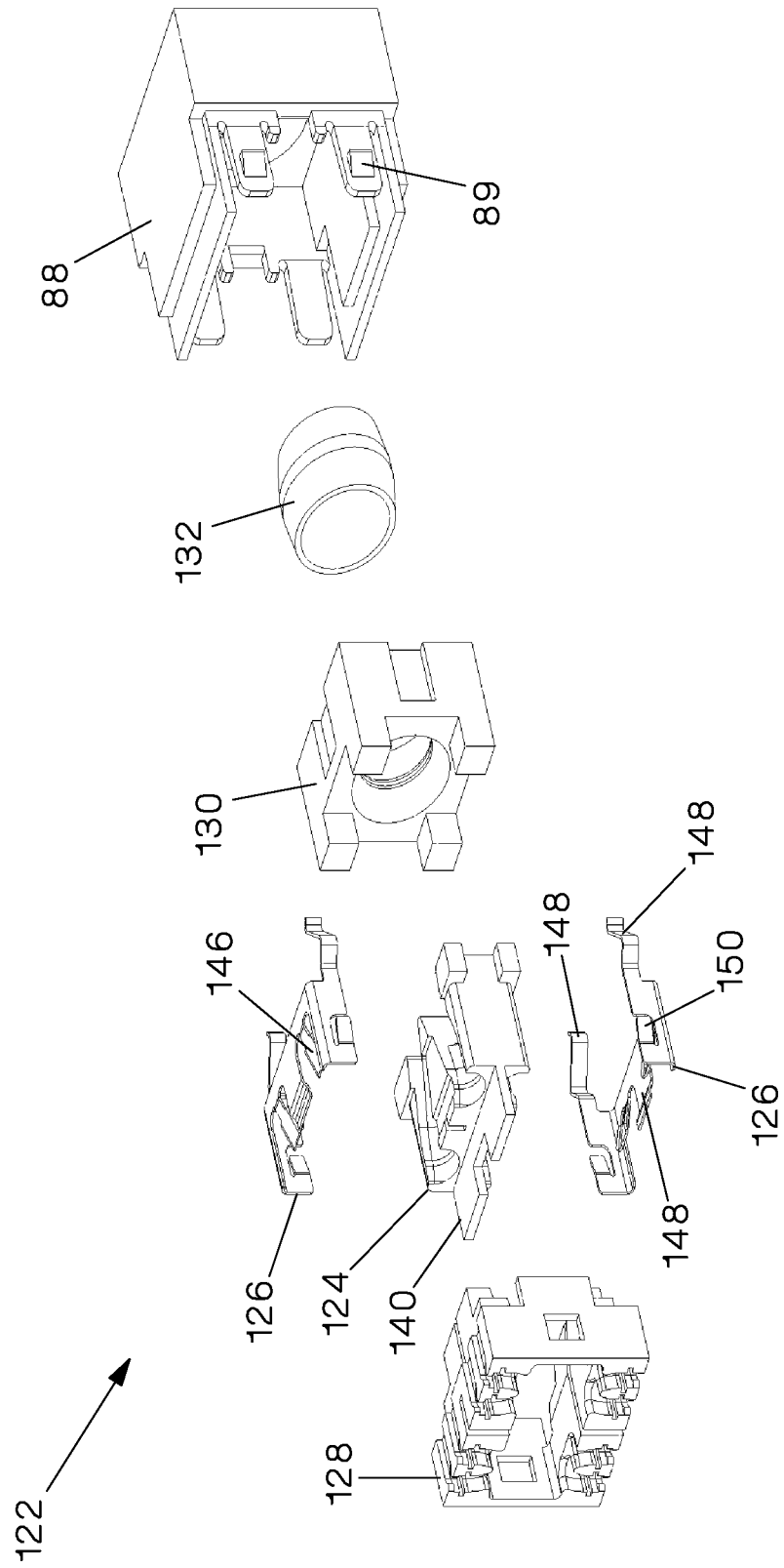
FIG. 9 is an exploded view of the rear cap assembly of the RJ45/ARJ45 switchable jack of FIG. 2.
Figure 10:
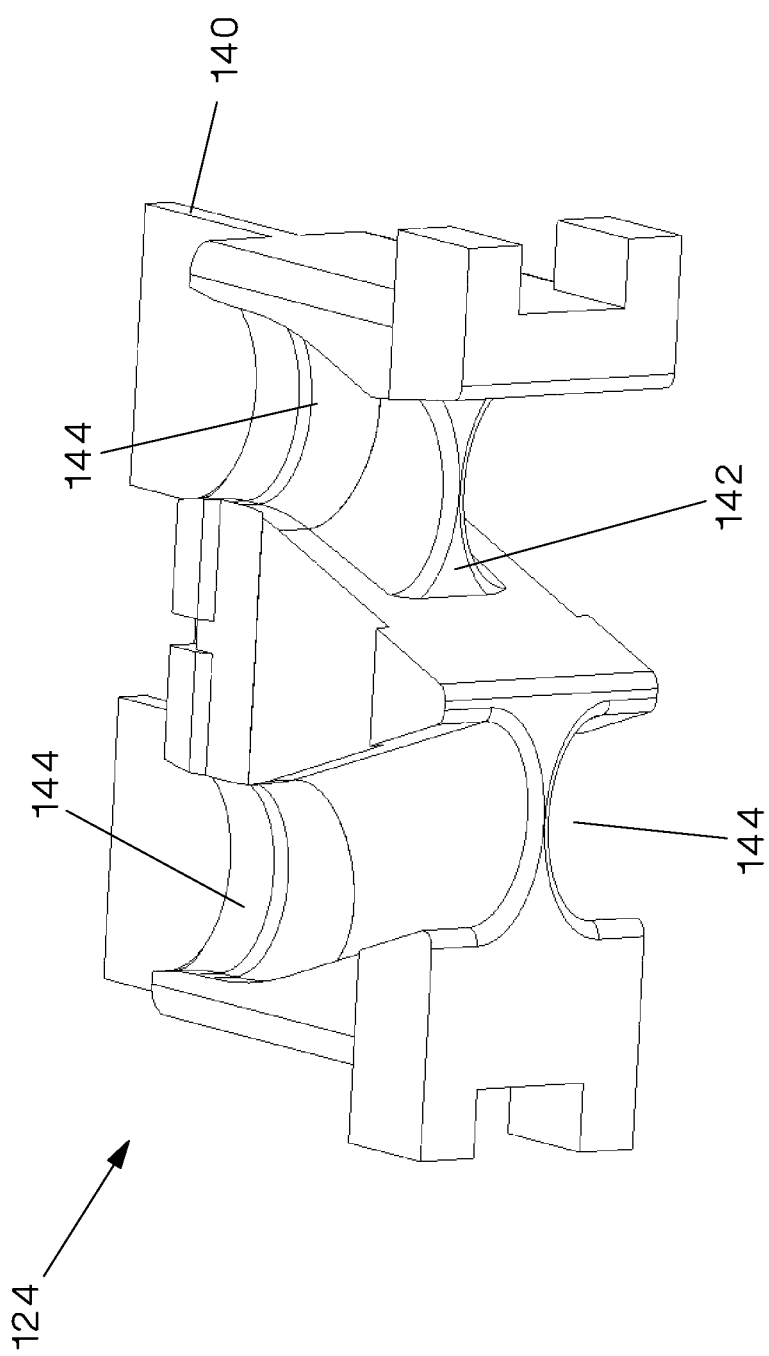
FIG. 10 is a perspective view of the foil divider of the rear cap assembly of FIG. 9.

Rear cap assembly 122 is shown exploded in FIG. 9 and is composed of foil divider 124, grounding contact 126, conductor holder 128, strain relief collar 130, compression ring 132, and rear cover 88. Cable 56 is inserted through rear cover 88 and compression ring 132. The wire braid from cable 56 is captured between compression ring 132 and strain relief collar 130 resulting in a grounding path for the jack and strain relief for the cable. The four individually foiled pairs are then placed into the foil channels 144 (FIG. 10). One side of foil divider 124 has offset slot 142 to accommodate the two foil pairs that cross over each other on the vertical plane, which is required to accommodate the end to end effect of twisted pair cabling. Grounding contact 126 provides a ground path for the foil pairs in the foil divider 124 with a compressive preload from grounding pads 146. Foil grounding pads 146 combined with foil channels 144 in foil divider 124 provide a comprehensive 360 degree ground path around the circumference of the foil pairs. Comprehensive grounding of the foil helps high frequency performance, particularly with respect to the prevention of common mode coupling. Grounding contact 126 also provides a ground path to vertical IDC isolator 86, foil divider 124, strain relief collar 130, and metal housing 62 via grounding surfaces 148. Snaps 150 secure conductor holder 128 onto foil divider 124. Rear cover 88 snaps into metal housing 62 via latches 89 to secure rear cap assembly 122 to switchable RJ45/ARJ45 jack 50.

PCB 76 (FIGS. 11-15) includes two isolated networks, one for RJ45 mode and one for the switched high bandwidth mode, and translates by rocker switch 66 (FIGS. 5-7) based upon which plug is inserted. The network for the RJ45 mode contains all of the necessary compensation elements to effectively cancel the crosstalk effects of RJ45 plug 52 such that it is compliant to ANSI/TIA-568-C.2. The network for high bandwidth mode does not contain any compensation elements but rather contains 100Ω impedance matched differential pair traces that connect PICs $70_{1-2}$, $70_{7-8}$, and $72_{3-6}$ (FIG. 5) to respective IDCs 78 and 80 (FIG. 8).

Figure 11:
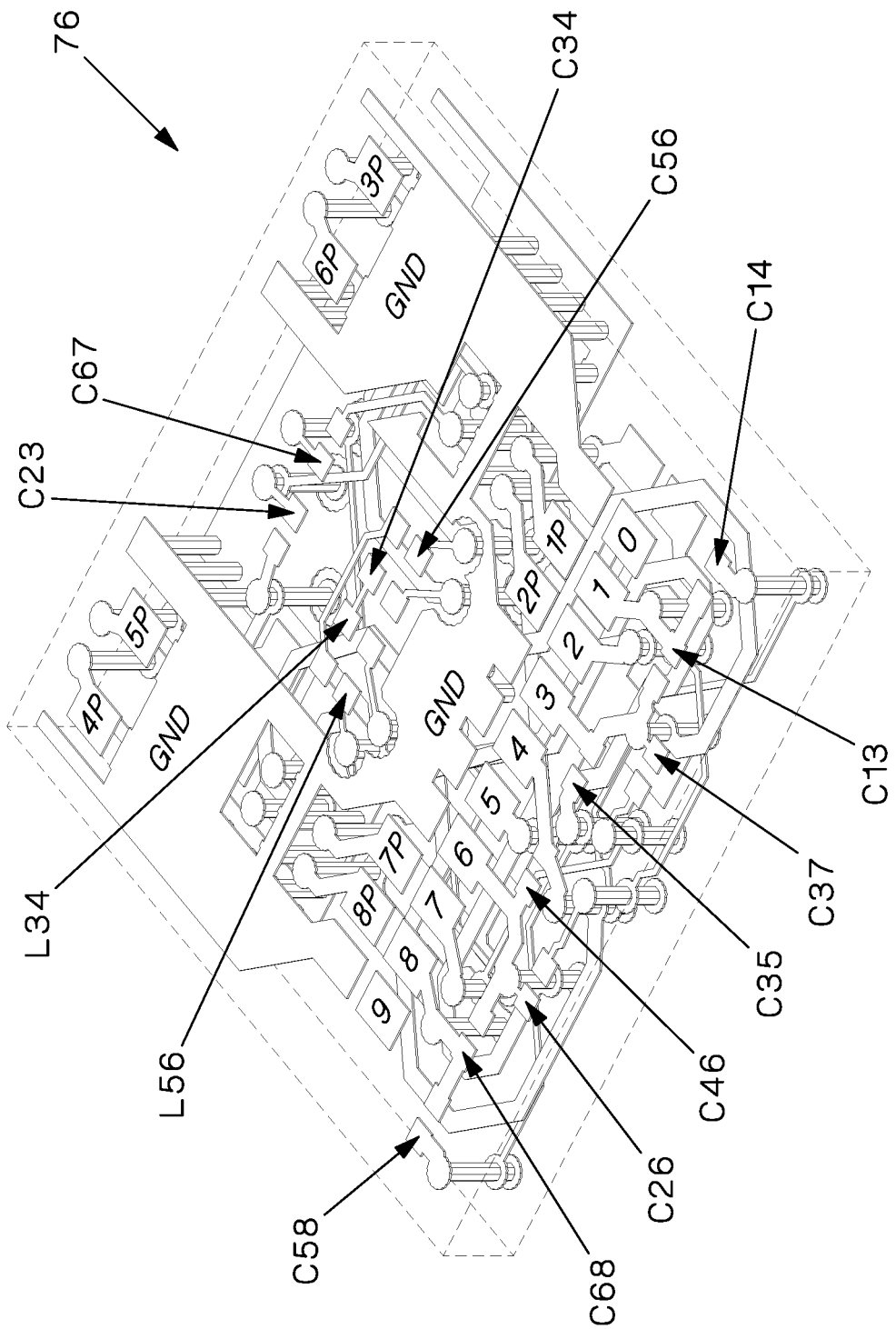
FIG. 11 is an isometric view of the PCB of the RJ45/ARJ45 switchable jack of FIG. 2.
Figure 15:
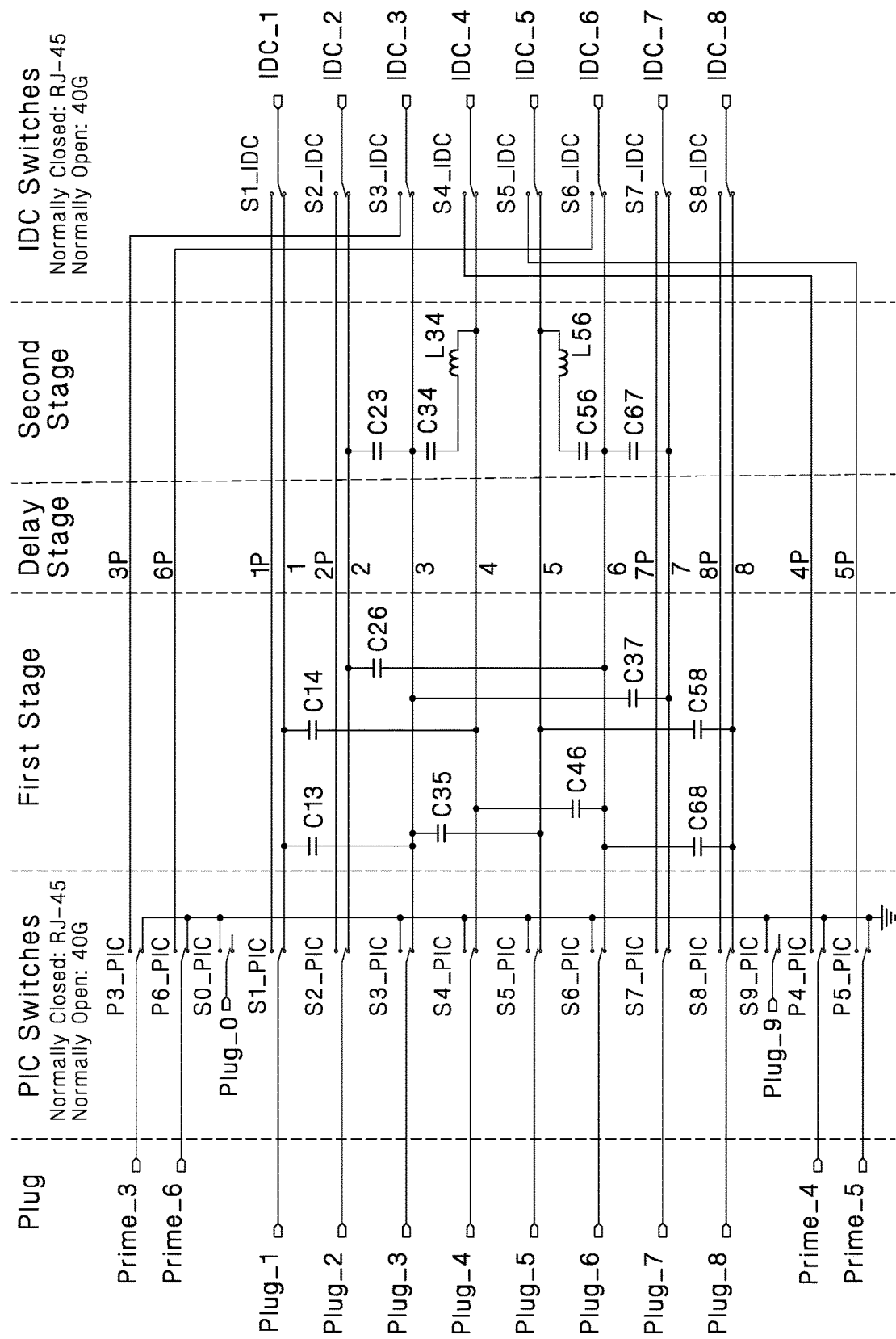
FIG. 15 is a schematic diagram of the switching network and the compensation circuitry of the PCB of FIG. 11.

The layout of PCB 76 is realized in six layers as shown in FIGS. 12-14, and as an isometric view in FIG. 11. FIG.

15 is a schematic of the switching network on PCB 76 along with the crosstalk compensation on PCB 76. Top layer 160 (FIG. 12) provides contact pads to interface with PICS 70 and 72 (FIG. 5). Bottom layer 161 (FIG. 12) provides contact pads to interface with IDCs 78 and 80 (FIG. 8). When an ARJ45 plug is inserted into the jack, rocker switch 66 positions PCB 76 such that PICs 70 and 72 are in contact with pads 1P through 8P and GND on top layer 160. Since an ARJ45 plug does not interface with PICs $70_3$, $70_4$, $70_5$, $70_6$ these PICs interface with GND pads on top layer 161 of PCB 76. By connecting PICs $70_3$, $70_4$, $70_5$, $70_6$ to GND pads along with PICs $70_0$, $70_9$, balanced transmission through PICs $70_1$, $70_2$, and $70_7$, $70_8$ is achieved as well as enhanced isolation between PICs $70_1$, $70_2$, and $70_7$, $70_8$. Traces on top layer 160 connect pads 1P through 8P to through-hole vias which in turn are connected to traces on bottom layer 161. On bottom layer 161, the traces are routed to contact pads 1P through 8P to interface with IDCs 78 and 80. This layout configuration completes the connection between the PICs and the IDCs when an ARJ45 plug is inserted into the jack. The contacts of an ARJ45 plug are arranged in a fashion such that there is a negligible amount of crosstalk between the pairs; therefore, no crosstalk compensation is required on PCB 76 during the high bandwidth mode of operation.

When an RJ45 plug is inserted into the jack, rocker switch 66 positions PCB 76 such that PICs 70 and 72 are in contact with pads 0 through 9 on top layer 160. Traces on top layer 160 connect pads 1 through 8 to through-hole vias. For pairs 12 and 78, the through-hole vias are connected to traces on bottom layer 161 which are routed to contact pads 1, 2, 7, and 8 to interface with the IDCs. For pairs 36 and 45, the through-hole vias are connected to traces on internal layers 3 and 4 (reference numbers 162 and 163, respectively, FIG. 13) which are routed to additional through-hole vias. These through-hole vias are connected to traces on bottom layer 161 which are routed to contact pads 3, 4, 5, and 6 to interface with the IDCs. Internal layers 2 and 5 (reference numbers 164 and 165, respectively), are shown in FIG. 14. This layout configuration completes the connection between the PICs and the IDCs when an RJ45 plug is inserted into the jack.

In addition to completing the connection, this layout configuration must also support appropriate coupling between pairs to appropriately cancel the crosstalk that exists in an RJ45 plug. In this embodiment, two stage crosstalk cancellation techniques, as may be found in Panduit's U.S. Pat. No. 8,137,141 (incorporated by reference as if fully setforth herein) and adapted to the mechanical/electrical characteristics of the present invention jack, can be employed to cancel the plug crosstalk between pairs 36-45, 36-12, and 36-78. FIG. 12 shows the location of the crosstalk cancellation capacitors on top layer 160. In this embodiment the coupling between conductors is implemented with discrete surface mount components. Capacitor C46 provides coupling between conductors 4 and 6 and capacitor C35 provides coupling between conductors 3 and 5. Together C46 and C35 comprise the first stage of NEXT compensation for the 36-45 pair combination. Components C56, L56 provide a lattice coupling network between conductors 5 and 6, and components C34, L34 provide a lattice coupling network between conductors 3 and 4. Together C56, L56, C34, and L34 comprise the second stage of NEXT compensation for the 36-45 pair combination. Capacitor C13 provides coupling between conductors 1 and 3 and capacitor C26 provides coupling between conductors 2 and 6. Together, C13 and C26 comprise the first stage of NEXT compensation for the 36-12 pair combination. Capacitor C23 provides coupling between conductors 2 and 3 which comprises the second stage of NEXT compensation for the 36-12 pair combination. Capacitor C68 provides coupling between conductors 6 and 8 and capacitor C37 provides coupling between conductors 3 and 7. Together, C68 and C37 comprise the first stage of NEXT compensation for the 36-78 pair combination. Capacitor C67 provides coupling between conductors 6 and 7 which comprises the second stage of NEXT compensation for the 36-78 pair combination. For pair combinations 12-45 and 45-78, single stage compensation techniques are implemented to sufficiently compensate for the crosstalk that exists in the RJ45 plug. Capacitor C14 provides coupling between conductor 1 and conductor 4 to create the single stage of NEXT compensation between the 12 and 45 pairs. Capacitor C58 provides coupling between conductor 5 and conductor 8 to create the single stage of NEXT compensation between the 45 and 78 pairs.

In addition to providing NEXT compensation of RJ45 plugs, PCB 76 must also provide appropriate coupling to satisfy the FEXT requirement for pair combination 36-45. This is achieved by way of incorporating the appropriate amount of inductive compensation in combination with the capacitive compensation for the 36-45 pair combination. In FIG. 13, internal layer 3 shows a portion of the current carrying traces of conductor 3 and conductor 5. These traces are arranged over a portion of their length in a parallel fashion which creates the appropriate amount of inductive coupling between these traces. Internal layer 4 (FIG. 14) shows a portion of the current carrying traces of conductor 4 and conductor 6. These traces are arranged over a portion of their length in a parallel fashion which creates the appropriate amount of inductive coupling between these traces. The inductive coupling between traces 3 and 5 along with the inductive coupling between traces 4 and 6 comprises the necessary inductive compensation between the 36-45 pairs. Along with the capacitive compensation between the 36-45 pairs described in the previous paragraphs, the NEXT and FEXT requirements can be satisfied for pair combination 36-45.

PCB 76 also incorporates a GND structure shown in FIG. 12 on the top and bottom layers 160, 161. Through-hole vias are positioned on PCB 76 to connect the top and bottom structures 160, 161. The position of these vias reduces crosstalk between the four pairs of conductors as the signals propagate through the circuit board. This is mainly important when the jack is operating in the high bandwidth mode. Another function of the GND structure on the PCB is to provide a continuous signal path between the cable and pair shields within the patch cord to the cable and pair shields within the horizontal cabling.

Although communication system 46 is illustrated as a patch panel in FIG. 1, alternatively it can be other active or passive equipment. Examples of passive equipment can be, but are not limited to, modular patch panels, punch-down patch panels, coupler patch panels, wall jacks, etc. Examples of active equipment can be, but are not limited to, Ethernet switches, routers, servers, physical layer management systems, and power-over-Ethernet equipment as can be found in data centers and or telecommunications rooms; security devices (cameras and other sensors, etc.) and door access equipment; and telephones, computers, fax machines, printers and other peripherals as can be found in workstation areas. Communication system 46 can further include cabinets, racks, cable management and overhead routing systems, and other such equipment. Cables 56, 58, 60 can be used in a variety of structured cabling applications including patch cords, zone cords, backbone cabling, and horizontal cabling, although the present invention is not limited to such applications. In general, the present invention can be used in military, industrial, telecommunications, computer, data communications, marine and other cabling applications.

The compensation circuitry for RJ45 mode can alternatively be orthogonal compensation circuitry (OCN) as described in U.S. patent application Ser. No. 13/681,480, filed on Nov. 20, 2012, entitled "COMPENSATION NETWORK USING AN ORTHOGONAL COMPENSATION NETWORK," incorporated by reference as if fully set forth herein.

While particular embodiments and applications of the present invention have been illustrated and described, it is to be understood that the invention is not limited to the precise construction and compositions disclosed herein and that various modifications, changes, and variations may be apparent from the foregoing without departing from the spirit and scope of the invention as described.

The invention claimed is:

1. A communication connector, comprising:
a housing configured for receiving a communication plug;
a printed circuit board at least partially within said housing;
a rocker switch at least partially within said housing, said rocker switch configured to rotate about a pivot point for actuating said printed circuit board; and
a translating crossbar at least partially within said housing, said translating crossbar engaging said rocker switch and causing said rocker switch to rotate about the pivot point.

2. The communication connector of claim 1, further including at least one spring connected to said housing and configured for biasing said switch and said crossbar against a nose of the plug.

3. The communication connector of claim 2, wherein said housing includes a latch stop and the plug includes a latch, said biasing positioning the latch against said latch stop.

4. The communication connector of claim 1 wherein the rocker switch has a lever arm which engages a notch in the printed circuit board.

* * * * *